(12) United States Patent
Krieg et al.

(10) Patent No.: US 6,501,273 B2
(45) Date of Patent: Dec. 31, 2002

(54) METHOD FOR THREE-DIMENSIONALLY CORRECTING DISTORTIONS AND MAGNETIC RESONANCE APPARATUS FOR IMPLEMENTING THE METHOD

(75) Inventors: Robert Krieg, Nuremberg (DE); Oliver Schreck, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 17 days.

(21) Appl. No.: 09/878,473

(22) Filed: Jun. 11, 2001

(65) Prior Publication Data

US 2002/0035779 A1 Mar. 28, 2002

(30) Foreign Application Priority Data

Jun. 9, 2000 (DE) .......................................... 100 28 560

(51) Int. Cl.⁷ .................................................. G01V 3/00
(52) U.S. Cl. ........................ 324/309; 324/318; 324/307
(58) Field of Search ................................ 324/309, 307, 324/312, 318, 300; 335/306; 382/128

(56) References Cited

U.S. PATENT DOCUMENTS

| | | | | |
|---|---|---|---|---|
| 4,689,563 A | * | 8/1987 | Bottomley et al. | 324/309 |
| 5,099,208 A | | 3/1992 | Fitzpatrick et al. | 324/312 |
| 5,530,352 A | | 6/1996 | Kolem | 324/309 |
| 5,614,827 A | | 3/1997 | Heid | 324/320 |
| 5,790,006 A | * | 8/1998 | Abele et al. | 335/306 |
| 5,886,524 A | | 3/1999 | Krieg | 324/312 |
| 6,066,949 A | * | 5/2000 | Alley | 324/309 |
| 6,252,401 B1 | | 6/2001 | Werthner et al. | 324/309 |

* cited by examiner

*Primary Examiner*—Edward Lefkowitz
*Assistant Examiner*—Brij B. Shrivastav
(74) *Attorney, Agent, or Firm*—Schiff Hardin & Waite

(57) ABSTRACT

In a method and apparatus for three-dimensionally correcting distortions of an image dataset, a magnetic resonance device containing a basic field magnetic system for generating a basic magnetic field and a gradient system for generating gradient fields generates an image dataset and coefficients of a spherical function-series expansion of the basic magnetic field and/or of the gradient fields are used for the correction. Coefficients are thereby used, which have been determined, in the framework of a design and/or production procedure, forth basic field magnetic system and/or gradient system.

6 Claims, 1 Drawing Sheet

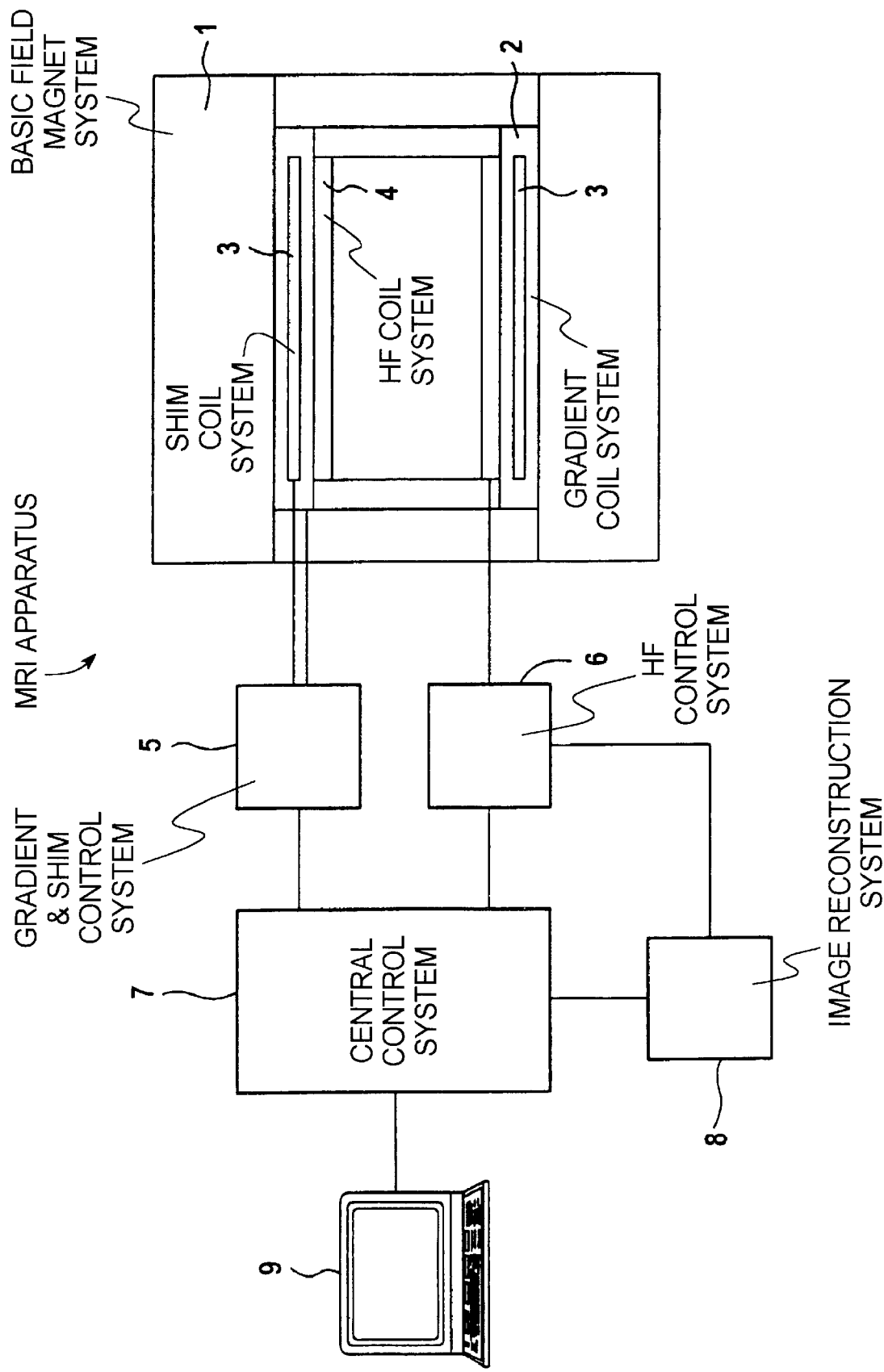

METHOD FOR THREE-DIMENSIONALLY CORRECTING DISTORTIONS AND MAGNETIC RESONANCE APPARATUS FOR IMPLEMENTING THE METHOD

BACKGROUND OF THE INVENTION

1. Field of the Invention

The present invention relates to a method for three-dimensionally correcting distortions of an image dataset and a magnetic resonance apparatus for implementing the method.

2. Description of the Prior Art

Magnetic resonance is a known technique for acquiring images of the inside of a body of an examination subject. In a magnetic resonance apparatus, rapidly switched gradient fields that are generated by a gradient system are superimposed onto a static basic magnetic field, which is generated by a basic field magnet system. Furthermore, the magnetic resonance apparatus has a high-frequency system, which irradiates high-frequency signals into the examination subject for triggering magnetic resonance signals and which receives the generated magnetic resonance signals, on the basis of which image datasets are prepared.

In magnetic resonance imaging, sufficient homogeneity of the basic magnetic field constitutes a determining factor for the quality of the magnetic resonance images. Non-homogeneity of the basic magnetic field, within an imaging volume of the apparatus, thereby causes geometric distortions of the magnetic resonance image, which is proportional to the field non-homogeneity. The same is true for non-linearities of the gradient fields.

A distortion-free and location-accurate imaging is important for many applications, for example when magnetic resonance images are used for planning radiotherapy of tumors or for preparing or performing a surgical intervention.

Magnetic resonance apparatuses are known which have an examination space for accepting the examination subject, such as a patient, which can be accessed from all sides for the purpose of intraoperative interventions and which is large and openly designed for accommodating claustrophobic patients. In apparatuses of this type, the problem of distortions is intensified as a result of the construction, particularly at the edges of the imaging volume and in apparatuses having an intense basic magnetic field.

A shim device is a known measure for improving the basic magnetic field homogeneity. Shim coils are used for this purpose, which homogenize the basic magnetic field when suitably operated with direct currents. As is known from German Patent 195 11 791, the basic magnetic field can be described within the imaging volume with coefficients of a spherical function series expansion. The shim coils are normally fashioned such that they essentially compensate a specific inhomogeneous field portion corresponding to one of the coefficients. A corresponding correcting measure is not utilized for the gradient fields.

For example, U.S. Pat. No. 5,099,208 discloses a pick-up method for magnetic resonance images wherein, despite non-homogeneity of the basic magnetic field, an image dataset having only little distortion is produced by a combination of two image datasets, which are generated by specific pulse sequences. For this purpose, a first image dataset is produced from an area of the examination subject to be imaged by a first pulse sequence. Subsequently, a second image dataset is produced from the same area to be imaged by a second pulse sequence, which differs from the first pulse sequence only by virtue of exchanged operational signs. Finally, a third image dataset free of distortions is obtained by combining two image datasets. In the aforementioned method, the obtainable exactness of the distortion correction, however, is limited to 2 to 3 mm topical resolution. Furthermore, such a course of action cannot be performed for all pulse sequences, and the pick-up time is doubled, since two image datasets are picked up for acquiring a magnetic resonance image with little distortion, so that only a reduced patient throughput can be achieved.

A method for correcting distortions as a result of non-homogeneity of the basic magnetic field and/or non-linearities of the gradient is disclosed in German Patent 198 29 850 which utilizes coefficients of the spherical function-series expansion for the basic magnetic field and/or for the gradient fields in order to eliminate distortions of an image dataset. At least coefficients describing field non-homogeneity of the basic magnetic field and/or nonlinear field components of the gradient fields are used. The precision of the correcting method depends on the exact knowledge of the aforementioned coefficients. The coefficients are determined using as phantom. For this purpose, the phantom is positioned in the imaging volume of the magnetic resonance apparatus and magnetic resonance images of the phantom are picked up. The coefficients are determined from a partially automatic evaluation and partially manual evaluation of these magnetic resonance images. Since the entire imaging volume of the magnetic resonance apparatus is acquired by the phantom, it is comparatively large with approximately 0.25 $m^3$, comparatively heavy with more than 20 kg and therefore is correspondingly difficult to handle. As a result of component drift in the magnetic resonance apparatus, the pickups with the phantom are repeated every two to three weeks for determining the coefficients. The apparatus is unavailable for examining patients during the repetitions of the pickups. Moreover, only a precision of 2 to 3 mm spatial resolution can be obtained for correction of distortions using coefficients that have been determined on the basis of the phantom.

SUMMARY OF THE INVENTION

An object of the present invention is to create an improved method for precisely three-dimensionally correcting distortions of an image dataset and a magnetic resonance apparatus for implementing the method, which, among other things, alleviates the aforementioned disadvantages of known methods and apparatuses.

The above object is achieved in accordance with the principles of the present invention in a method for three-dimensionally correcting distortions of an image dataset obtained in a magnetic resonance apparatus having a basic field magnet system and a gradient system, wherein coefficients of a spherical function-series expansion of the basic magnetic field and/or of the gradient field are utilized for correcting the distortions, and wherein these coefficients are determined in a design and/or production procedure for the basic magnetic field system and/or the gradient system.

The above object also is achieved in a magnetic resonance imaging system designed to implement the above-described method.

Since coefficients are used, which, due to the inventive method, are very precisely determined in the framework of a design (development) and/or production procedure for the basic field magnet field and/or gradient system, they are also available with high precision for the method for three-dimensionally correcting distortions. Among other things, high precision can be obtained during the correction of distortions as a result thereof. Furthermore, magnetic resonance pickups of a phantom for determining coefficients therefore are not necessary. The disadvantages that are associated with the aforementioned phantom method therefore do not occur. It is also not necessary to repeat pulse sequences, which extends the pickup time, for eliminating distortions.

DESCRIPTION OF THE DRAWINGS

The single FIGURE is a schematic block diagram of a magnetic resonance imaging apparatus constructed and operating in accordance with the principles of the present invention.

DESCRIPTION OF THE PREFERRED EMBODIMENTS

The magnetic resonance apparatus shown in the FIGURE has a basic field magnet system 1 for generating a basic magnetic field and a gradient coil system 2 for generating gradient fields. A shim coil system 3 is integrated into the gradient coil system 2 for homogenizing the basic magnetic field. The gradient coil system 2 and the shim coil system 3 are connected to a gradient and shim control system 5 in order to control currents in the gradient coil system 2 and in the shim coil system 3. The apparatus also has a high-frequency coil system 4, which is connected to a high-frequency control system 6. The high-frequency system 4 emits, high-frequency signals that are irradiated into an examination subject for triggering magnetic resonance signals, and the generated magnetic resonance signals are picked up. Corresponding image datasets are generated in an image reconstruction system 8 on the basis of the picked up magnetic resonance signals. For this purpose, the image reconstruction system 8 is connected to the high-frequency control system 6. Magnetic resonance images corresponding to the image datasets can be displayed at a display and operating console 9. For this purpose, the display and operating console 9 is connected to the image reconstruction system 8 via a central control system 7. The central control system 7 is also connected to the gradient and shim control system 5 and to the high-frequency control system 6 for controlling a coordinated operation of the magnetic resonance apparatus.

The image reconstruction system 8 is fashioned such that a method for three-dimensionally correcting distortions corresponding to the aforementioned German Patent 198 29 850 can be implemented. For this purpose, distortions of an image dataset are three-dimensionally corrected, which are caused by nonlinear field components of the gradient fields.

A magnetic flux density B (r, θ, (φ)) of one of the gradient fields of a gradient coil of the gradient coil system 2 can be described by a spherical function-series expansion according to the following equation:

$$B(r, \theta, \varphi) = \sum_{l=0}^{\infty} r^l \sum_{m=0}^{\infty} P(l, m)(\cos\theta) \cdot [A_{(l,m)} \cdot \cos(m\varphi) + B_{(l,m)} \cdot \sin(m\varphi)]$$

$A_{(l,m)}$ and $B_{(l,m)}$ are the coefficients with a suitable scaling. As spherical coordinates, the radius r and the angle θ describe a point of the three-dimensional space proceeding from an origin. The origin is generally determined in the center of the gradient coil system 2. $P_{(l,m)}$ (cosθ) is a Legendre polynomial expansion or are functions dependent on cosθ.

Given a longitudinal tubular (cylindrical) gradient coil, only coefficients $A_{(l,m)}$ with an uneven l and particularly with m=0 occur due to its symmetry properties for the magnetic flux density in the inside of the coil. Given a transversal tubular (cylindrical) gradient coil, only the coefficients $A_{(l,m)}$ or $B_{(l,m)}$ with uneven l and uneven m are of importance due to its symmetry properties. This is apparent from the following table, in which the coefficients $A_{(l,m)}$ that are important in practical operation for the aforementioned longitudinal and transversal gradient coils and the meaning of these coefficients are entered. Only coefficients $A_{(l,m)}$ for the transversal gradient coil are shown, the same indexing applies for a gradient coil with coefficients $B_{(l,m)}$.

| longitudinal | transversal | meaning |
| --- | --- | --- |
| $A_{(1,0)}$ | $A_{(1,1)}$ | gradient field |
| $A_{(3,0)}$ | $A_{(3,1)}$; $A_{(3,3)}$ | interference 3rd order |
| $A_{(5,0)}$ | $A_{(5,1)}$; $A_{(5,3)}$; $A_{(5,5)}$ | interference 5th order |
| $A_{(7,0)}$ | $A_{(7,1)}$; $A_{(7,3)}$; $A_{(7,5)}$; $A_{(7,7)}$ | interference 7th order |
| $A_{(9,0)}$ | $A_{(9,1)}$; $A_{(9,3)}$; $A_{(9,5)}$; $A_{(9,7)}$; $A_{(9,9)}$ | interference 9th order |

Apart from the coefficient $A_{(1,0)}$ all other coefficients $A_{(l,m)}$ are equal to zero for an ideal longitudinal gradient coil. Apart from the coefficient $A_{(1,1)}$, all other coefficients $A_{(l,m)}$ or $B_{(l,m)}$ are equal to zero for an ideal transversal gradient coil.

The correcting method uses coefficients describing the nonlinear field components of the gradient fields. For this purpose, the image reconstruction system 8 has a memory area with a table having the coefficients permanently stored. An example of such a table is as follows:

| coefficients |
| --- |
| longitudinal gradient coil |
| $A_{(3,0)} = -0.091$ |
| $A_{(5,0)} = -0.029$ |
| $A_{(7,0)} = +0.011$ |
| $A_{(9,0)} = -0.002$ |
| first transveral gradient coil |
| $A_{(3,1)} = -0.074$ |
| $A_{(3,3)} = +0.0025$ |
| $A_{(5,1)} = -0.030$ |
| $A_{(7,1)} = +0.009$ |
| $A_{(9,1)} = -0.0015$ |
| second transversal gradient coil |
| $B_{(3,1)} = -0.068$ |
| $B_{(3,3)} = -0.0024$ |
| $B_{(5,1)} = 0.033$ |
| $B_{(7,1)} = 0.01$ |
| $B_{(9,1)} = -0.0015$ |

The table only contains the coefficients that are particularly relevant for the image quality. The coefficients are permanently stored dependent on the utilized gradient coil system 2 and result from a design and/or production procedure for the gradient coil system 2, wherein they are naturally very precisely determined. In an embodiment of the magnetic resonance apparatus, the coefficients are permanently stored for different types of the gradient coil system 2 that can be used. It is only necessary to modify the coefficients when the gradient coil system 2 is exchanged with a gradient coil system 2 of a different type.

Distortions that are caused by inhomogeneous field components of the basic magnetic field can be correspondingly corrected. In the magnetic resonance apparatus with an active shim device shown in the figure, it is expedient to only consider inhomogeneous field components, i.e., coefficients of the basic magnetic field, during the correction, which are not compensated by the active shim device. In a magnetic resonance apparatus without a shim device, it is expedient to take all inhomogeneous field components, i.e., the corresponding coefficients, into consideration during the correcting method.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for three-dimensionally correcting distortions of an image dataset, comprising the steps of:

fabricating a magnetic resonance apparatus including a basic field magnet system and a gradient system in a fabrication procedure which includes at least one of a design procedure for said basic field magnet system, a production procedure for said basic field magnet system, a design procedure for said gradient system, and a production procedure for said gradient system;

operating said basic field magnet system and said gradient system to respectively generate a basic magnetic field and gradient fields and thereby obtaining an image dataset, each of said basic magnetic field and said gradient fields being subject to respective distortions which produce correspond distortions in said image dataset;

in said fabrication procedure, prior to generating said image dataset, determining at least one set of coefficients selected from the group consisting of a first set of coefficients for a spherical function-series expansion of said basic magnetic field and a second set of coefficients for a spherical function-series expansion of at least one of said gradient fields; and correcting said distortions in said image dataset produced by distortions of at least one of said basic magnetic field and said at least one of said gradient fields by employing said first set of coefficients for correcting said distortions in said basic magnetic field and employing said second set of coefficients for correcting said distortions in said a least one of said gradient fields.

2. A method as claimed in claim 1 comprising storing said first and second sets of coefficients obtained during said fabrication procedure, as stored coefficients, and using said stored coefficients for correcting said distortions.

3. A method as claimed in claim 1 wherein the step of fabricating a magnetic resonance apparatus further comprises including an active shim device in said magnetic resonance apparatus, and wherein the step of determining said first and second sets of coefficients comprises determining said first set of coefficients taking operation of said active shim device into account and determining said second set of coefficients taking operation of said active shim device into account.

4. A method as claimed in claim 1 wherein the step of determining said first set of coefficients comprises determining a first set of coefficients for correcting for distortions caused by inhomogeneities in said basic magnetic field.

5. A method as claimed in claim 1 wherein the step of determining said second set of coefficients comprises determining coefficients for correcting for distortions caused by a non-linear field component of said at least one of said gradient fields.

6. An apparatus for three-dimensionally correcting distortions of an image dataset, comprising:

a magnetic resonance apparatus including a basic field magnet system and a gradient system fabricated in a fabrication procedure which includes at least one of a design procedure for said basic field magnet system, a production procedure for said basic field magnet system, a design procedure for said gradient system, and a production procedure for said gradient system;

said basic field magnet system and said gradient system being operable to respectively generate a basic magnetic field and gradient fields to obtain an image dataset, each of said basic magnetic field and said gradient fields being subject to respective distortions which produce corresponding distortions in said image dataset;

a memory for storing at least one set of coefficients, obtained in said fabrication procedure, prior to generating said image dataset, selected from the group consisting of a first set of coefficients for a spherical function-series expansion of said basic magnetic field and a second set of coefficients for a spherical function-series expansion of at least one of said gradient fields; and an image reconstruction system for producing an image from said image dataset and for correcting said distortions in said image dataset produced by said distortions at least one of said basic magnetic field and said at least one of said gradient fields by employing said first set of coefficients for correcting said distortions in said basic magnetic field and employing said second set of coefficients for correcting said distortions in said at least one of said gradient fields.

* * * * *